(12) United States Patent
Lee (10) Patent No.: US 9,337,817 B2
(45) Date of Patent: May 10, 2016

(54) HOLD-TIME OPTIMIZATION CIRCUIT AND RECEIVER WITH THE SAME

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

(*) Notice: Subject to any disclaimer, the term of this patent is extended or adjusted under 35 U.S.C. 154(b) by 20 days.

(21) Appl. No.: 14/306,567

(22) Filed: Jun. 17, 2014

(65) Prior Publication Data

US 2015/0365081 A1   Dec. 17, 2015

(51) Int. Cl.
| | |
|---|---|
| H03K 9/00 | (2006.01) |
| H03K 5/13 | (2014.01) |
| H03K 3/037 | (2006.01) |
| H03L 7/08 | (2006.01) |
| H03L 7/081 | (2006.01) |
| H04L 7/033 | (2006.01) |
| H04B 1/16 | (2006.01) |
| H04L 7/00 | (2006.01) |
| H03K 5/00 | (2006.01) |

(52) U.S. Cl.
CPC ............. *H03K 5/131* (2013.01); *H03K 3/0375* (2013.01); *H03L 7/0807* (2013.01); *H03L 7/0814* (2013.01); *H04B 1/16* (2013.01); *H04L 7/0037* (2013.01); *H04L 7/0337* (2013.01); *H03K 2005/00058* (2013.01)

(58) Field of Classification Search
CPC ... H03K 5/1565; H03K 5/135; H03K 5/1534; G11C 11/4076; G11C 29/023; G06F 13/1689; H04L 7/0037; H04L 7/044; H04L 7/0087; G01R 31/31922; H03H 11/265; H02M 1/44
USPC .......... 375/316, 354, 355, 371; 714/707, 799; 713/400, 500, 401; 365/233.1; 327/158, 270, 291
See application file for complete search history.

(56) References Cited

U.S. PATENT DOCUMENTS

| | | | | |
|---|---|---|---|---|
| 5,815,017 A | * | 9/1998 | McFarland | ........... H04L 7/0337 327/158 |
| 5,952,857 A | | 9/1999 | Suzuki | |
| 6,178,212 B1 | | 1/2001 | Akashi | |
| 7,759,998 B2 | | 7/2010 | Ishikawa | |
| 2005/0231244 A1 | * | 10/2005 | Hartfiel | ..................... G06F 1/12 327/141 |
| 2007/0080728 A1 | * | 4/2007 | Iwata | ........................ H03L 7/07 327/156 |
| 2008/0001641 A1 | | 1/2008 | Uchida et al. | |
| 2008/0054957 A1 | | 3/2008 | Takeda et al. | |

FOREIGN PATENT DOCUMENTS

| | | |
|---|---|---|
| EP | 0 884 732 | 12/1998 |
| JP | 2007-202033 | 8/2007 |
| JP | 2007-208774 | 8/2007 |

OTHER PUBLICATIONS

European Search report dated Apr. 28, 2015, issued in application No. 14192781.4.

* cited by examiner

*Primary Examiner* — Leila Malek (74) *Attorney, Agent, or Firm* — McClure, Qualey & Rodack, LLP (57) ABSTRACT

A hold-time optimization circuit includes a correction circuit and a delay control circuit. The delay control circuit delays a clock signal for a delay time so as to generate a delay clock signal. The correction circuit generates a correction pulse signal according to transition edges of a data signal and transition edges of the delay clock signal. The delay time of the delay control circuit is optimized according to the correction pulse signal. The data signal is sampled according to the delay clock signal.

15 Claims, 11 Drawing Sheets

HOLD-TIME OPTIMIZATION CIRCUIT AND RECEIVER WITH THE SAME

BACKGROUND OF THE INVENTION

1. Field of the Invention

The disclosure generally relates to a hold-time optimization circuit, and more particularly, to a hold-time optimization circuit and a receiver including the hold-time optimization circuit.

2. Description of the Related Art

For a digital circuit, "hold time" means the minimum period of time within which a data signal should be held steadily after a clock event occurs (e.g., the clock event may mean transition edges like a rising edge or a falling edge of a clock signal). It is difficult for a designer to set the hold time appropriately. If the hold time is insufficient, the digital circuit may capture the sampling data in erroneous data cycles. Conversely, if the hold time is too long, the setup time and cycle time of the digital circuit may be prolonged, and the speed of the digital circuit may be decreased.

BRIEF SUMMARY OF THE INVENTION

In a preferred embodiment, the invention is directed to a hold-time optimization circuit, including: a delay control circuit, delaying a clock signal for a delay time so as to generate a delay clock signal, wherein the delay time is adjusted according to a correction pulse signal; and a correction circuit, generating the correction pulse signal according to transition edges of a data signal and transition edges of the delay clock signal, wherein the data signal is sampled according to the delay clock signal.

In some embodiments, the data signal includes a bit, and the correction circuit includes a glitch generation circuit. In some embodiments, the glitch generation circuit includes: a rising-edge detector, generating a first detection signal according to rising edges of the bit; a falling-edge detector, generating a second detection signal according to falling edges of the bit; a first AND gate, wherein the first AND gate has a first input terminal for receiving the first detection signal, a second input terminal for receiving the delay clock signal, and an output terminal; a second AND gate, wherein the second AND gate has a first input terminal for receiving the second detection signal, a second input terminal for receiving the delay clock signal, and an output terminal; and a first OR gate, wherein the first OR gate has a first input terminal coupled to the output terminal of the first AND gate, a second input terminal coupled to the output terminal of the second AND gate, and an output terminal for outputting the correction pulse signal. In some embodiments, the rising-edge detector includes: a second inverter, wherein the second inverter has an input terminal for receiving the bit, and an output terminal; and a third AND gate, wherein the third AND gate has a first input terminal for receiving the bit, a second input terminal coupled to the output terminal of the second inverter, and an output terminal for outputting the first detection signal. In some embodiments, the falling-edge detector includes: a third inverter, wherein the third inverter has an input terminal for receiving the bit, and an output terminal; and an NOR gate, wherein the NOR gate has a first input terminal for receiving the bit, a second input terminal coupled to the output terminal of the third inverter, and an output terminal for outputting the second detection signal. In some embodiments, the data signal includes a plurality of bits, and the correction circuit includes a plurality of glitch generation circuits. In some embodiments, each of the glitch generation circuits includes: a rising-edge detector, generating a first detection signal according to rising edges of a respective bit; a falling-edge detector, generating a second detection signal according to falling edges of the respective bit; a first AND gate, wherein the first AND gate has a first input terminal for receiving the first detection signal, a second input terminal for receiving the delay clock signal, and an output terminal; a second AND gate, wherein the second AND gate has a first input terminal for receiving the second detection signal, a second input terminal for receiving the delay clock signal, and an output terminal; and a first OR gate, wherein the first OR gate has a first input terminal coupled to the output terminal of the first AND gate, a second input terminal coupled to the output terminal of the second AND gate, and an output terminal. In some embodiments, the correction circuit further includes a second OR gate, and wherein the second OR gate has a plurality of input terminals respectively coupled to the output terminals of all of the first OR gates of the glitch generation circuits, and an output terminal for outputting the correction pulse signal. In some embodiments, the rising-edge detector includes: a second inverter, wherein the second inverter has an input terminal for receiving the respective bit, and an output terminal; and a third AND gate, wherein the third AND gate has a first input terminal for receiving the respective bit, a second input terminal coupled to the output terminal of the second inverter, and an output terminal for outputting the first detection signal. In some embodiments, the falling-edge detector includes: a third inverter, wherein the third inverter has an input terminal for receiving the respective bit, and an output terminal; and an NOR gate, wherein the NOR gate has a first input terminal for receiving the respective bit, a second input terminal coupled to the output terminal of the third inverter, and an output terminal for outputting the second detection signal. In some embodiments, the delay control circuit includes: a first switch, wherein the first switch has a first terminal coupled to a control node, and a second terminal coupled to a direct current (DC) voltage source; a second switch, wherein the second switch has a first terminal coupled to a current source, and a second terminal coupled to the control node; a capacitor, wherein the capacitor has a first terminal coupled to the control node, and a second terminal coupled to a ground voltage; and a voltage-controlled delay (VCD) circuit, delaying the clock signal for the delay time, and generating the delay clock signal, wherein the delay time is determined by a control voltage at the control node. In some embodiments, when the hold-time optimization circuit has been powered on, the first switch switches from a closed state to an opened state and is kept opened, wherein every time the second switch receives the correction pulse signal equal to a high logic level, the second switch is closed, and wherein every time the second switch receives the correction pulse signal equal to a low logic level, the second switch is opened. In some embodiments, wherein if the control voltage is increased, the delay time becomes shorter. In some embodiments, the delay control circuit includes: a counter, counting a digital number, wherein every time the counter receives the correction pulse signal equal to a high logic level, the counter increases the digital number; and a digital-controlled delay (DCD) circuit, delaying the clock signal for the delay time, and generating the delay clock signal, wherein the delay time is determined by the digital number. In some embodiments, if the digital number is increased, the delay time becomes shorter.

In another preferred embodiment, the invention is directed to a receiver, including: a data delay circuit, delaying a data signal so as to generate a delay data signal; a hold-time optimization circuit, including: a delay control circuit, delaying a clock signal for a delay time so as to generate a delay clock signal, wherein the delay time is adjusted according to a correction pulse signal; and a correction circuit, generating the correction pulse signal according to transition edges of the delay data signal and transition edges of the delay clock signal; and a D flip-flop, wherein the D flip-flop has a data terminal for receiving the delay data signal, a clock terminal for receiving the delay clock signal, and an output terminal for outputting a sampling signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Figure 1:
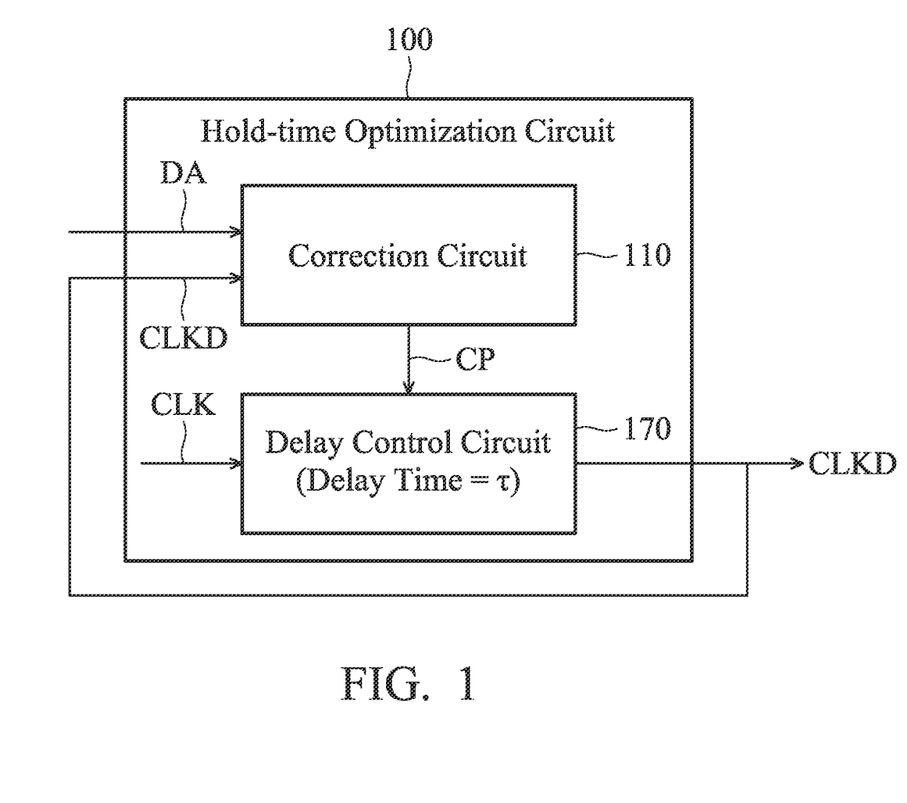
FIG. 1 is a diagram of a hold-time optimization circuit according to an embodiment of the invention.

FIG. 1 is a diagram of a hold-time optimization circuit 100 according to an embodiment of the invention. As shown in FIG. 1, the hold-time optimization circuit 100 at least includes a correction circuit 110 and a delay control circuit 170. The hold-time optimization circuit 100 may be used in a digital circuit, such as a low-power digital integrated circuit for sampling data. A data signal DA and a clock signal CLK of the digital circuit may be applied to the hold-time optimization circuit 100. The delay control circuit 170 delays the clock signal CLK for delay time τ so as to generate a delay clock signal CLKD. That is, the clock signal CLK and the delay clock signal CLKD may have identical waveforms but different phases. The correction circuit 110 generates a correction pulse signal CP according to the data signal DA and the delay clock signal CLKD. The delay time τ of the delay control circuit 170 is optimized according to the correction pulse signal CP. By using such a feedback path, the hold time between the delay clock signal CLKD and the data signal DA is fine-tuned accordingly. The detailed structure and operation of the hold-time optimization circuit 100 will be described in the following embodiment. It should be understood that the following embodiments are just exemplary, rather than limitations of the invention. The invention may be implemented in a variety of ways.

Figure 2A:
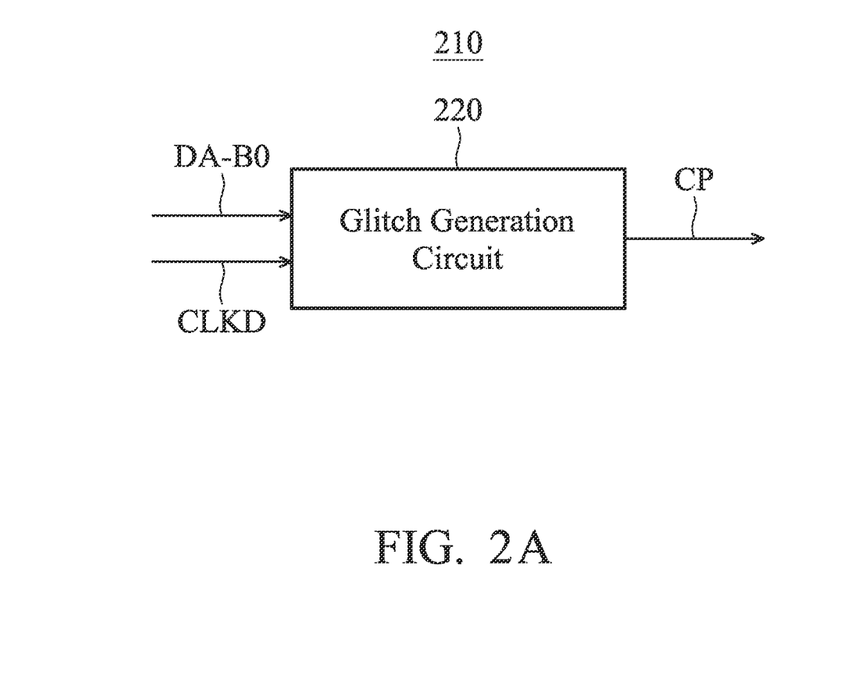
FIG. 2A is a diagram of a correction circuit according to an embodiment of the invention.

FIG. 2A is a diagram of a correction circuit 210 according to an embodiment of the invention. In the embodiment of FIG. 2A, the data signal DA includes a bit DA-B0, and the correction circuit 210 includes a glitch generation circuit 220. The glitch generation circuit 220 detects the timing relationship between the delay clock signal CLKD and the bit DA-B0, and the correction circuit 210 generates the correction pulse signal CP accordingly. More particularly, the correction pulse signal CP indicates whether there is hold time violation between the delay clock signal CLKD and the data signal DA according to the aforementioned timing relationship. For example, if the hold time is insufficient, the correction pulse signal CP may rise to a high logic level, and conversely, if the hold time is sufficient, the correction pulse signal CP may be maintained at a low logic level.

Figure 2B:
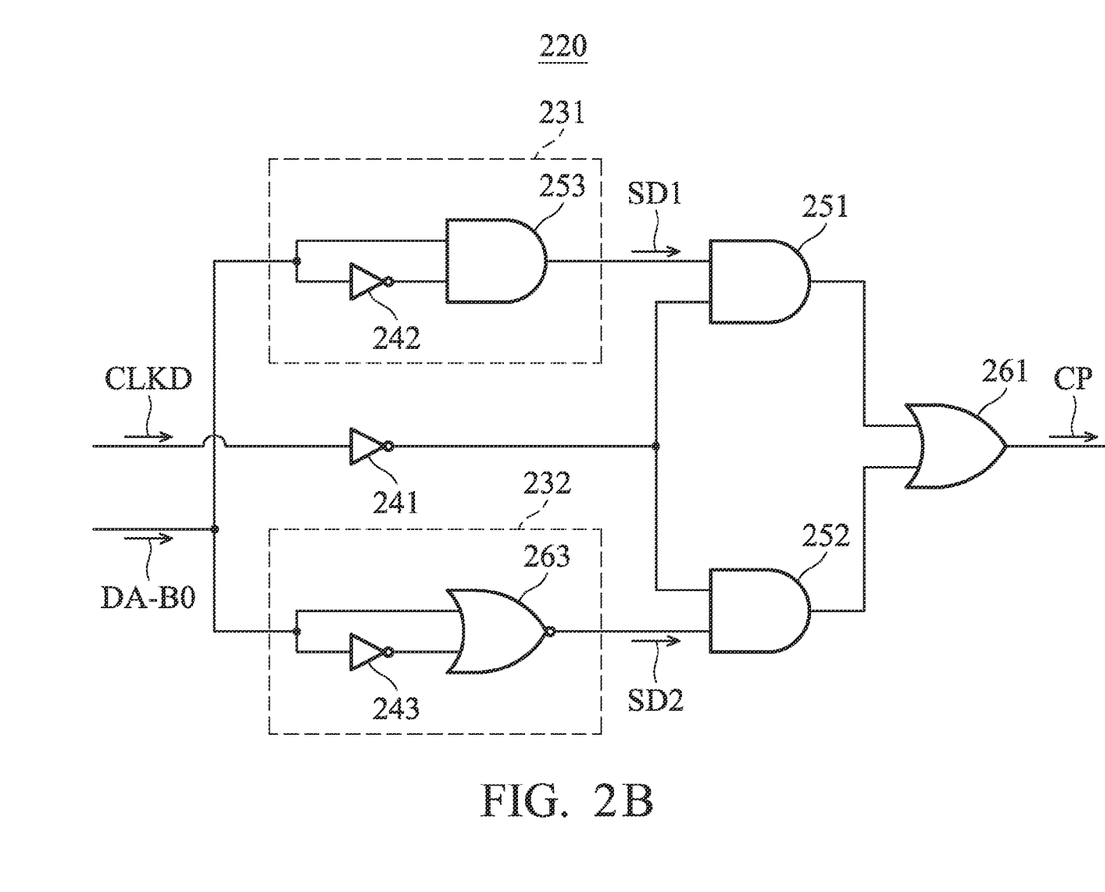
FIG. 2B is a diagram of a glitch generation circuit according to an embodiment of the invention.

FIG. 2B is a diagram of the glitch generation circuit 220 according to an embodiment of the invention in which the data signal DA is sampled at the rising edge of the delay clock signal CLKD. In the embodiment of FIG. 2B, the glitch generation circuit 220 includes a rising-edge detector 231, a falling-edge detector 232, a first inverter 241, a first AND gate 251, a second AND gate 252, and a first OR gate 261. The rising-edge detector 231 detects the low-to-high transition of the data signal DA, and generates a first detection signal SD1 according to the bit DA-B0. The falling-edge detector 232 detects the high-to-low transition of the data signal DA, and generates a second detection signal SD2 according to the bit DA-B0. The first inverter 241 has an input terminal for receiving the delay clock signal CLKD, and an output terminal. The first AND gate 251 has a first input terminal for receiving the first detection signal SD1, a second input terminal coupled to the output terminal of the first inverter 241, and an output terminal. The second AND gate 252 has a first input terminal for receiving the second detection signal SD2, a second input terminal coupled to the output terminal of the first inverter 241, and an output terminal. The first OR gate 261 has a first input terminal coupled to the output terminal of the first AND gate 251, a second input terminal coupled to the output terminal of the second AND gate 252, and an output terminal for outputting the correction pulse signal CP. In some embodiments, the rising-edge detector 231 includes a second inverter 242 and a third AND gate 253. The second inverter 242 has an input terminal for receiving the bit DA-B0, and an output terminal. The third AND gate 253 has a first input terminal for receiving the bit DA-B0, a second input terminal coupled to the output terminal of the second inverter 242, and an output terminal for outputting the first detection signal SD1. In some embodiments, the falling-edge detector 232 includes a third inverter 243 and an NOR gate 263. The third inverter 243 has an input terminal for receiving the bit DA-B0, and an output terminal. The NOR gate 263 has a first input terminal for receiving the bit DA-B0, a second input terminal coupled to the output terminal of the third inverter 243, and an output terminal for outputting the second detection signal SD2. The first detection signal SD1 has a high-level pulse whenever the bit DA-B0 has a rising edge, where the width of the high-level pulse is determined by the circuit delay introduced by the second inverter 242; similarly, the second detection signal SD2 has a high-level pulse whenever the bit DA-B0 has a falling edge, where the width of the high-level pulse is determined by the circuit delay introduced by the third inverter 243. The first AND gate 251 outputs a high-level pulse when there is difference between the rising edge of the bit DA-B0 and the rising edge of the delay clock signal CLKD, and the second AND gate 252 outputs a high-level pulse when there is difference between the falling edge of the bit DA-B0 and the rising edge of the delay clock signal CLKD; therefore, the correction pulse signal CP is at high logic level when the rising edges of the delay clock signal CLKD fall behind the transition edges (rising edges and falling edges) of the bit DA-B0, i.e., when the hold time is insufficient. In another embodiment of the invention, when the data signal DA is sampled at the falling edge of the delay clock signal CLKD, the first inverter 241 is omitted and the second input terminals of the first AND gate 251 and the second AND gate 252 are directly used for receiving the delay clock signal CLKD. With the circuit structures of FIGS. 2A and 2B, if there is hold-time violation between the delay clock signal CLKD and the bit DA-B0, the correction pulse signal CP will rise to a high logic level; otherwise, the correction pulse signal CP will be kept at a low logic level. By monitoring the correction pulse signal CP from the correction circuit 210, the delay control circuit 170 can fine tune the delay time τ for the delay clock signal CLKD and therefore optimize the duration of the hold time.

Figure 3:
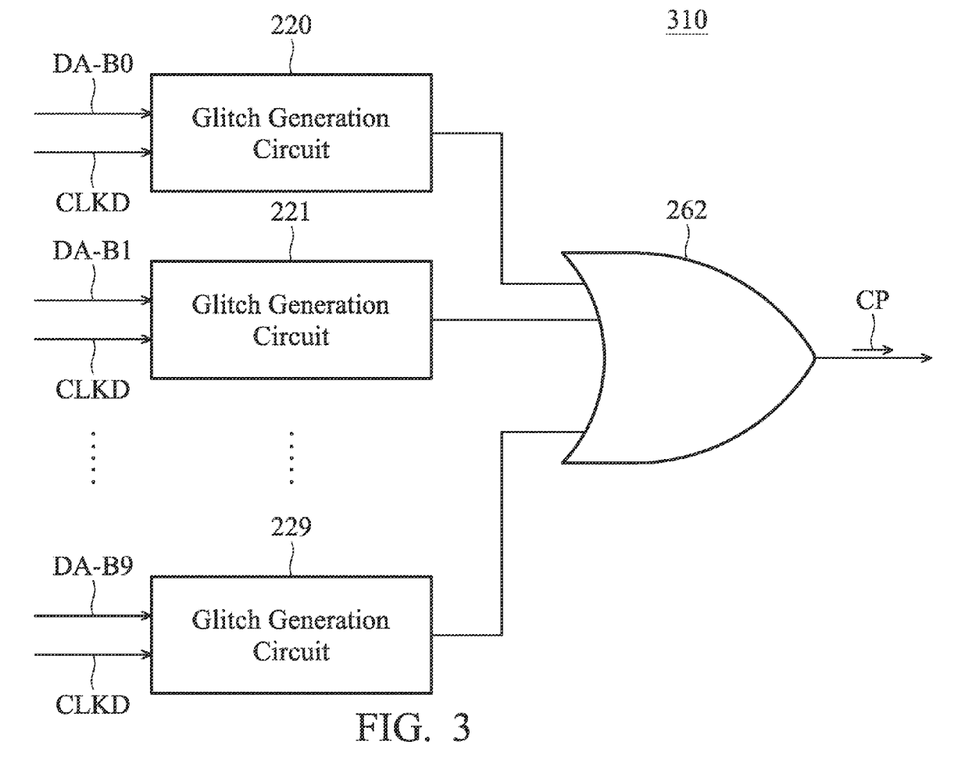
FIG. 3 is a diagram of a correction circuit according to an embodiment of the invention.

FIG. 3 is a diagram of a correction circuit 310 according to an embodiment of the invention. In the embodiment of FIG. 3, the data signal DA includes multiple bits DA-B0, DA-B1, ..., and DA-B9, and the correction circuit 310 includes multiple glitch generation circuits 220, 221, ..., and 229. The glitch generation circuits 220, 221, ..., and 229 detect the timing relationship between the delay clock signal CLKD and the bits DA-B0, DA-B1, ..., and DA-B9, respectively, and the correction circuit 310 generates the correction pulse signal CP accordingly. Each of the glitch generation circuits 220, 221, ..., and 229 has a respective circuit structure which is similar to that of FIG. 2B. The bit DA-B0 and the delay clock signal CLKD are applied to the glitch generation circuit 220, and the bit DA-B1 and the delay clock signal CLKD are applied to the glitch generation circuit 221, ..., and the bit DA-B9 and the delay clock signal CLKD are applied to the glitch generation circuit 229. The main difference from the embodiments of FIGS. 2A and 2B is that the correction circuit 310 of FIG. 3 further includes a second OR gate 262. The second OR gate 262 has multiple input terminals respectively coupled to the output terminals of all of the first OR gates of the glitch generation circuits 220, 221, ..., and 229. The second OR gate 262 further has an output terminal for outputting the correction pulse signal CP. With the circuit structures of FIG. 3, if there is hold-time violation between the delay clock signal CLKD and any of the bits DA-B0, DA-B1, ..., and DA-B9 (e.g., if the hold time is insufficient), the correction pulse signal CP equal will rise to a high logic level; otherwise, the correction pulse signal CP will be kept at a low logic level. By monitoring the correction pulse signal CP from the correction circuit 310, the delay control circuit 170 can fine tune the delay time τ for the delay clock signal CLKD and therefore optimize the duration of the hold time, even if there is more than one data bit applied to the hold-time optimization circuit 100. It is understood that although there are ten glitch generation circuits for processing ten data bits in FIG. 3, they are just exemplary, and another correction circuit including a different number of glitch generation circuits for processing a different number of data bits may be used in other embodiments. Other features of the correction circuit 310 are similar to those of the correction circuit 210 of FIGS. 2A and 2B. As a result, the two embodiments can achieve similar levels of performance.

Figure 4A:
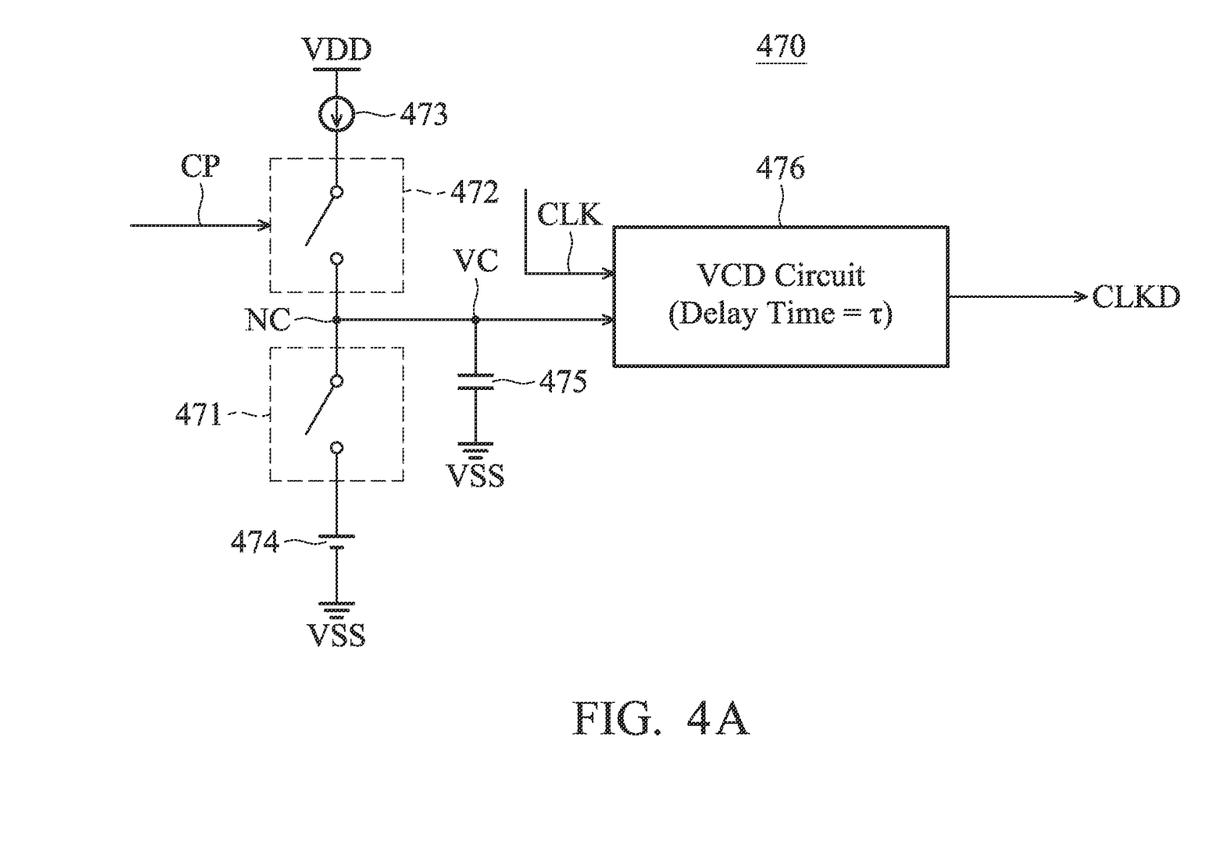
FIG. 4A is a diagram of a delay control circuit according to an embodiment of the invention.

FIG. 4A is a diagram of a delay control circuit 470 according to an embodiment of the invention. In the embodiment of FIG. 4A, the delay control circuit 470 includes a first switch 471, a second switch 472, a current source 473, a direct current (DC) voltage source 474, a capacitor 475, and a voltage-controlled delay (VCD) circuit 476. The current source 473 outputs a current at its current output terminal. The DC voltage source 474 has a positive electrode, and a negative electrode coupled to a ground voltage VSS (e.g., 0V). The first switch 471 has a first terminal coupled to a control node NC, and a second terminal coupled to the positive electrode of the DC voltage source 474. The second switch 472 has a first terminal coupled to the current output terminal of the current source 473, and a second terminal coupled to the control node NC. The capacitor 475 has a first terminal coupled to the control node NC, and a second terminal coupled to the ground voltage VSS. The VCD circuit 476 delays the clock signal CLK for the delay time τ, and generates the delay clock signal CLKD. The VCD circuit 476 may be implemented by common voltage-controlled delay circuits known by one having ordinary skill in the art. The delay time τ of the VCD circuit 476 is determined by a control voltage VC at the control node NC. The control voltage VC is further adjusted by the correction pulse signal CP. In some embodiments, the delay control circuit 470 is operated as follows. The first switch 471 is closed initially, and the DC voltage source 474 charges the control voltage VC of the capacitor 475 to an initial value. When the hold-time optimization circuit 100 has been powered on, the first switch 471 is switched from a closed state to an opened state and kept opened. Then, the second switch 472 selectively couples the current output terminal of the current source 473 to the control node NC so as to adjust the control voltage VC at the control node NC. Every time the second switch 472 receives the correction pulse signal CP equal to a high logic level, the second switch 472 is closed, and the control voltage VC of the capacitor 475 is charged up by the current source 473. Conversely, every time the second switch 472 receives the correction pulse signal CP equal to a low logic level, the second switch 472 is opened, and the control voltage VC of the capacitor 475 is kept unchanged.

Figure 4B:
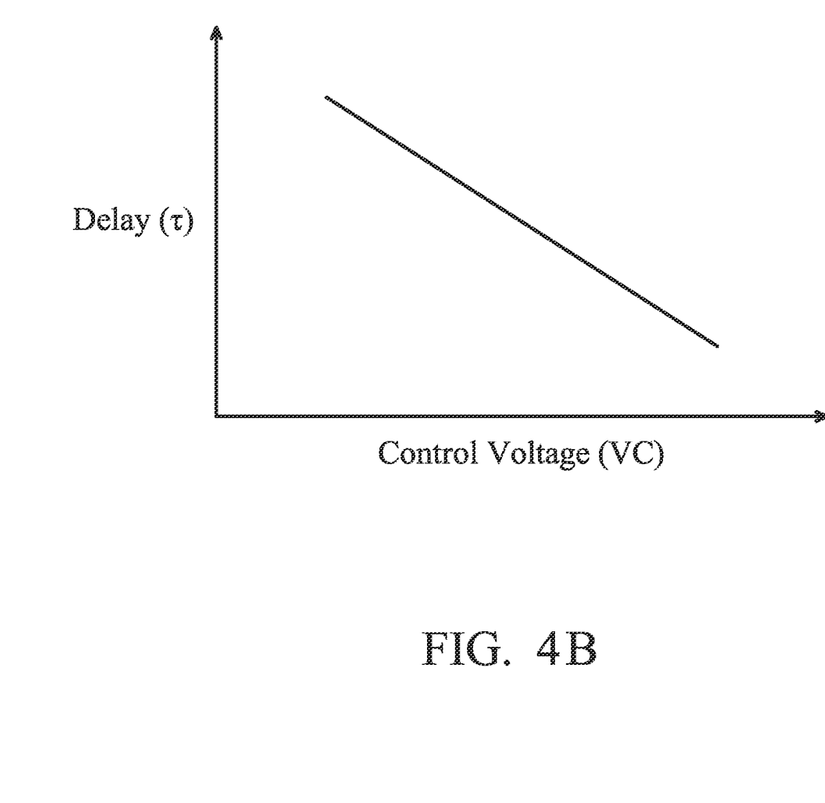
FIG. 4B is a diagram of the relationship between control voltage and delay time according to an embodiment of the invention.

FIG. 4B is a diagram of the relationship between the control voltage VC and the delay time τ according to an embodiment of the invention. Generally, if the control voltage VC is increased, the delay time τ will become shorter. In some embodiments, the delay time τ is inversely proportional to the control voltage VC (e.g., τ*VC=k1, and k1 is a constant value), but their relationship is not limited thereto. In some embodiments, the initial hold time is set as short as possible, and it gradually becomes longer and then reaches the optimized duration according to the indication of the correction pulse signal CP.

Figure 5A:
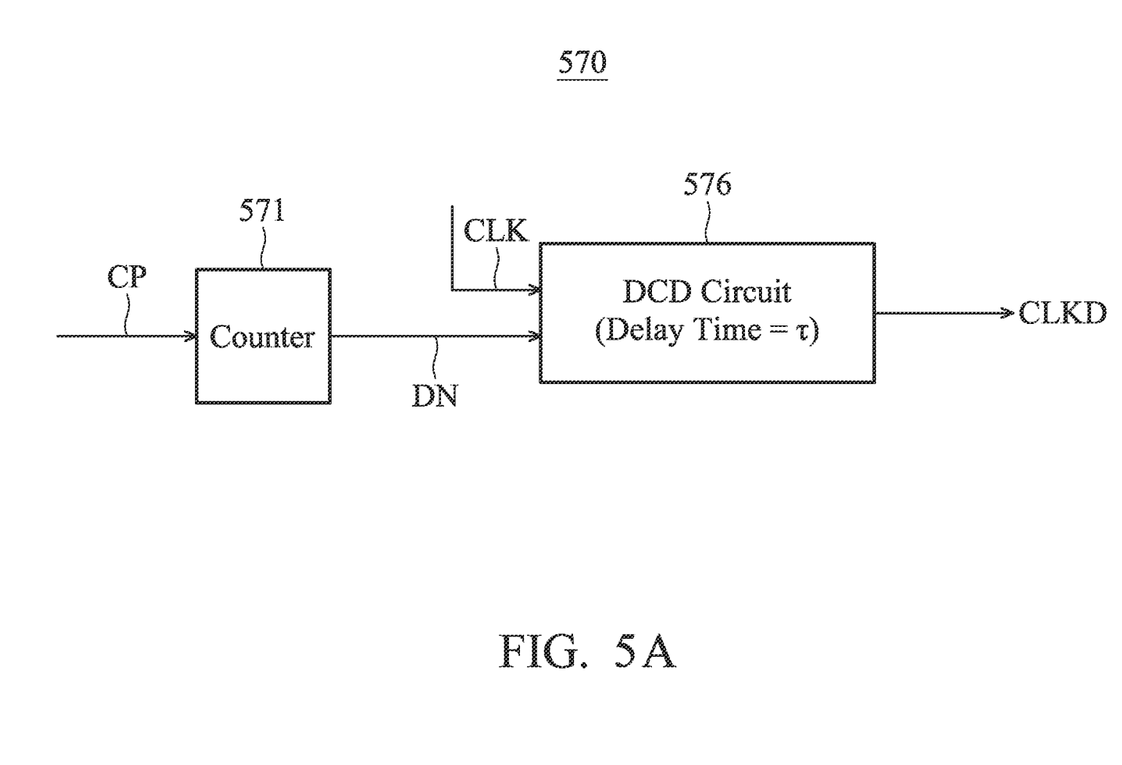
FIG. 5A is a diagram of a delay control circuit according to an embodiment of the invention.

FIG. 5A is a diagram of a delay control circuit 570 according to an embodiment of the invention. In the embodiment of FIG. 5A, the delay control circuit 570 includes a counter 571 and a digital-controlled delay (DCD) circuit 576. The counter 571 counts a digital number DN, which may be represented by multiple bits. The DCD circuit 576 delays the clock signal CLK for the delay time τ, and generates the delay clock signal CLKD. The DCD circuit 576 may be implemented by common digitally controlled delay circuits known by one having ordinary skill in the art. The delay time τ of the DCD circuit 576 is determined by the digital number DN. The digital number DN is further adjusted by the correction pulse signal CP. In some embodiments, the delay control circuit 570 is operated as follows. Every time the counter 571 receives the correction pulse signal CP equal to a high logic level, the counter 571 increases the digital number DN by 1. Conversely, every time the counter 571 receives the correction pulse signal CP equal to a low logic level, the counter 571 keeps the digital number DN unchanged.

Figure 5B:
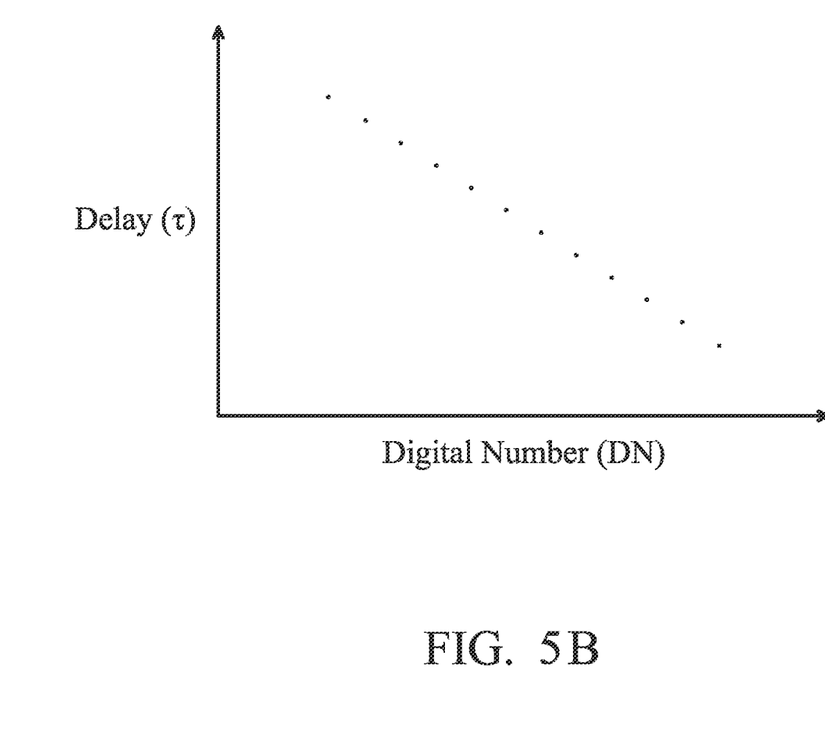
FIG. 5B is a diagram of the relationship between digital number and delay time according to an embodiment of the invention.

FIG. 5B is a diagram of the relationship between the digital number DN and the delay time τ according to an embodiment of the invention. Generally, if the digital number DN is increased, the delay time τ will become shorter. In some embodiments, the delay time τ is inversely proportional to the digital number DN (e.g., τ*DN=k2, and k2 is a constant value), but their relationship is not limited thereto. In some embodiments, the initial hold time is set as short as possible, and it gradually becomes longer and then reaches the optimized duration according to the indication of the correction pulse signal CP.

Figure 6:
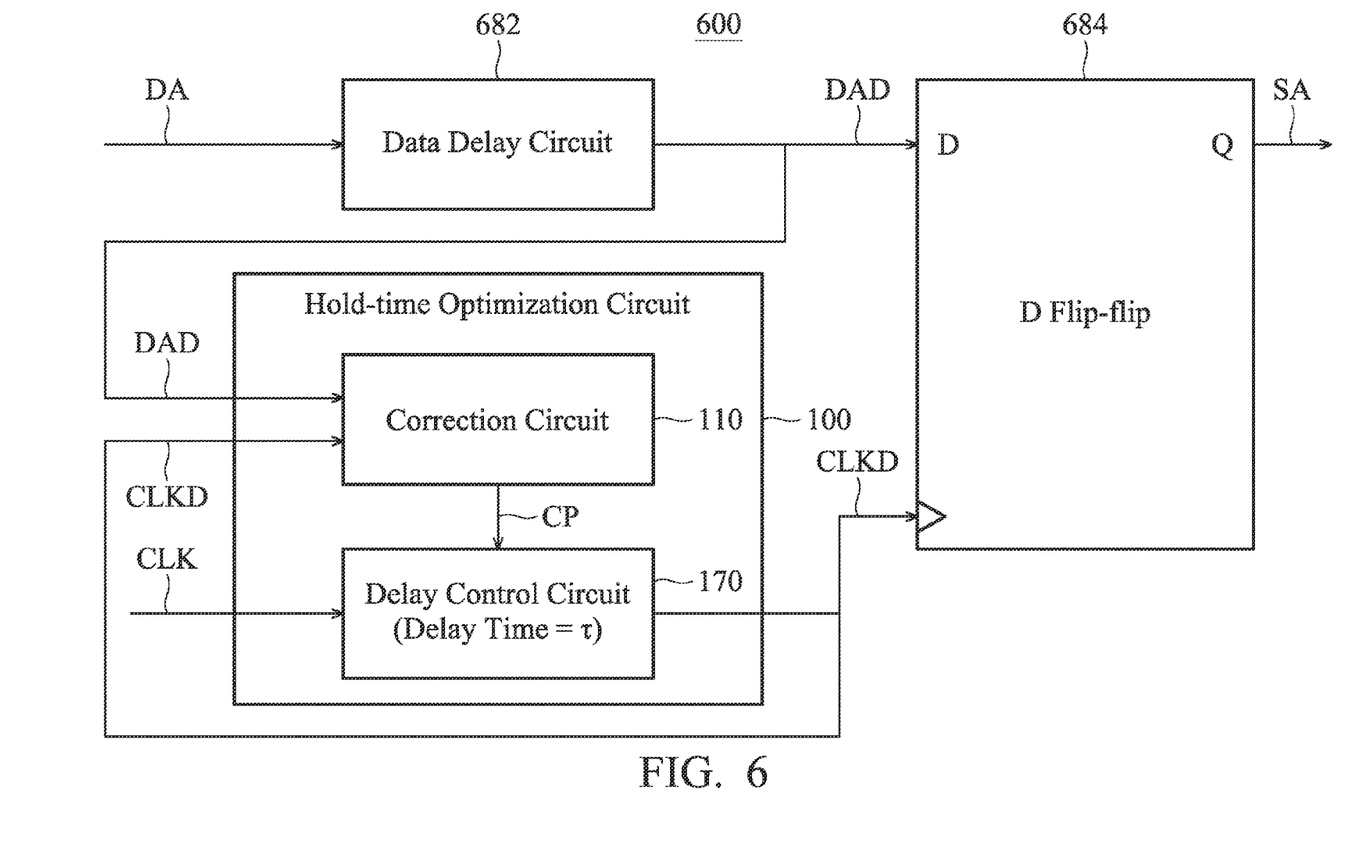
FIG. 6 is a diagram of a receiver including a hold-time optimization circuit according to an embodiment of the invention.

FIG. 6 is a diagram of a receiver 600 including the hold-time optimization circuit 100 according to an embodiment of the invention. In the embodiment of FIG. 6, the receiver 600 includes a data delay circuit 682, the hold-time optimization circuit 100, and a D flip-flop 684. The data delay circuit 682 delays a data signal DA for fixed delay time so as to generate a delay data signal DAD. As described in the embodiment of FIG. 1, the hold-time optimization circuit 100 includes a correction circuit 110 and a delay control circuit 170. The delay control circuit 170 delays a clock signal CLK for delay time τ so as to generate a delay clock signal CLKD. The correction circuit 110 generates a correction pulse signal CP according to the delay data signal DAD and the delay clock signal CLKD. The D flip-flop 684 has a data terminal for receiving the delay data signal DAD, a clock terminal for receiving the delay clock signal CLKD, and an output terminal for outputting a sampling signal SA. The D flip-flop 684 may be used to perform a data-sampling process according to the delay clock signal CLKD and the delay data signal DAD. For example, The D flip-flop 684 may sample the delay data signal DAD at every rising edge of the delay clock signal CLKD. In the embodiment of FIG. 6, the delay time τ of the delay control circuit 170 is optimized according to the correction pulse signal CP. By using such a feedback path, the hold time between the delay clock signal CLKD and the delay data signal DAD is fine-tuned. The detailed structure and operation of the hold-time optimization circuit 100 are almost the same as those described in the embodiments of FIGS. 1-5B. The only difference from the embodiments of FIGS. 1-5B is that the data signal DA is replaced with the delay data signal DAD to be applied to the hold-time optimization circuit 100 in the embodiment of FIG. 6.

Figure 7A:
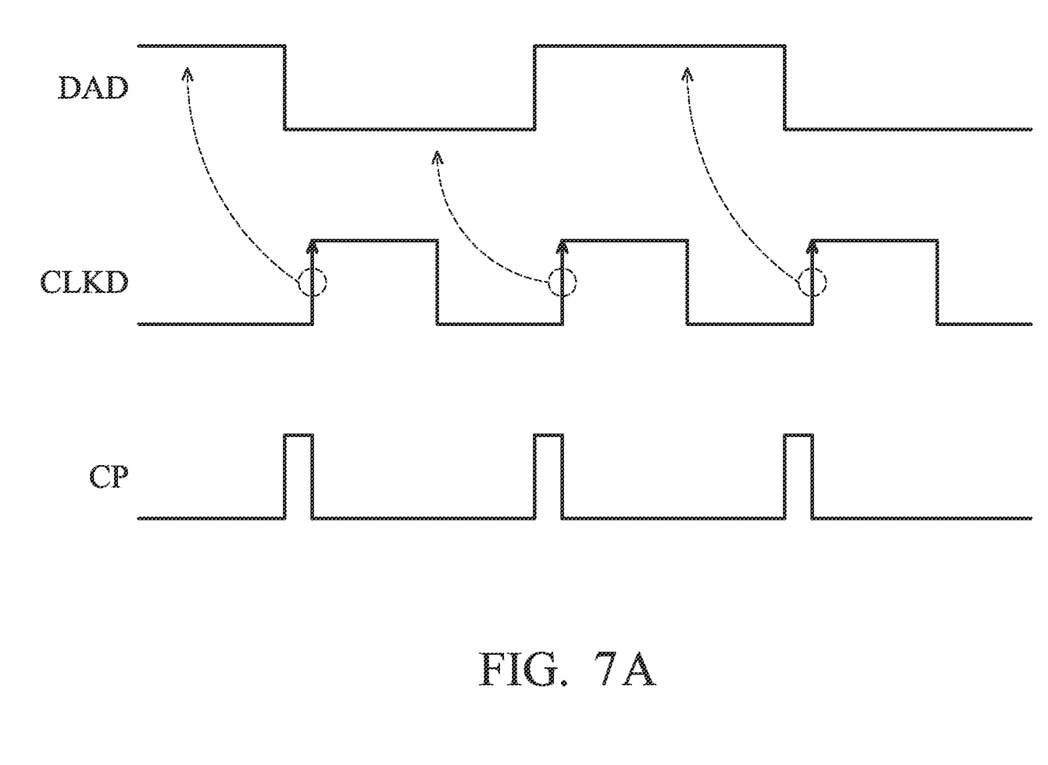
FIG. 7A is a diagram of signal waveforms of a receiver according to an embodiment of the invention.

FIG. 7A is a diagram of signal waveforms of the receiver 600 according to an embodiment of the invention. In the embodiment of FIG. 7A, before the hold time between the delay clock signal CLKD and the delay data signal DAD is fine-tuned, the rising edges of the delay clock signal CLKD may be aligned with erroneous cycles of the delay data signal DAD. For example, as shown in FIG. 7A, the hold time is negative, that is, the delay data signal DAD changes its state before each rising edge of the delay clock signal CLKD, such that the sampling signal SA of the D flip-flop 684 include wrong sampling data sampled at wrong times. In this case, the correction pulse signal CP of the correction circuit 110 include many high logic intervals so as to indicate that the current hold time is unacceptable (e.g., the hold time is insufficient).

Figure 7B:
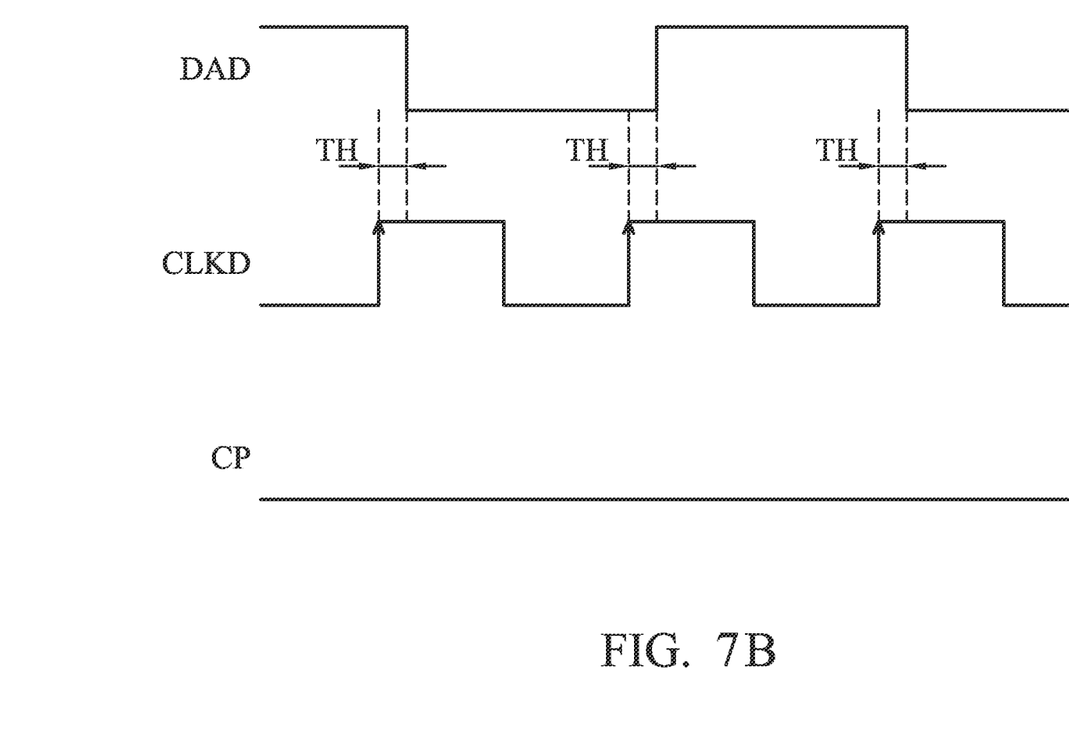
FIG. 7B is a diagram of signal waveforms of a receiver according to an embodiment of the invention.

FIG. 7B is a diagram of signal waveforms of the receiver 600 according to an embodiment of the invention. In the embodiment of FIG. 7B, after the hold time TH between the delay clock signal CLKD and the delay data signal DAD is fine-tuned, the rising edges of the delay clock signal CLKD should be aligned within right cycles of the delay data signal DAD. For example, as shown in FIG. 7B, the fine-tuned hold time TH is positive and sufficient, and the delay data signal DAD changes its state upon the expiry of the hold time TH after each rising edge of the delay clock signal CLKD, such that the sampling signal SA of the D flip-flop 684 only include correct sampling data. In this case, the correction pulse signal CP of the correction circuit 110 is maintained at a low logic level so as to indicate that the current hold time is acceptable.

The hold-time optimization circuit 100 of the invention is suitable for application in a variety of digital circuits, especially for digital-to-analog circuits. The hold-time optimization circuit 100 of the invention is almost independent of process, voltage, and temperature (PVT) variations, and can provide stable performance in different environments. The invention can be used to optimize the duration of hold time of the digital circuits, and it has the advantages of both improving the reliability of data-sampling process, and maintaining the operating speed of the whole system.

The invention may merely include any one or more features of any one or more embodiments of FIGS. 1-7B. In other words, not all of the features shown in the figures should be implemented in the hold-time optimization circuit and the receiver of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A hold-time optimization circuit, comprising:
   a delay control circuit, delaying a clock signal for a delay time so as to generate a delay clock signal, wherein the delay time is adjusted according to a correction pulse signal; and
   a correction circuit, generating the correction pulse signal according to transition edges of a data signal and transition edges of the delay clock signal,
   wherein the data signal is sampled according to the delay clock signal;
   wherein the data signal comprises a bit, and the correction circuit comprises a glitch generation circuit;
   wherein the glitch generation circuit comprises:
   a rising-edge detector, generating a first detection signal according to rising edges of the bit;
   a falling-edge detector, generating a second detection signal according to falling edges of the bit;
   a first AND gate, wherein the first AND gate has a first input terminal for receiving the first detection signal, a second input terminal coupled to the delay clock signal, and an output terminal;
   a second AND gate, wherein the second AND gate has a first input terminal for receiving the second detection signal, a second input terminal coupled to the delay clock signal, and an output terminal; and
   a first OR gate, wherein the first OR gate has a first input terminal coupled to the output terminal of the first AND gate, a second input terminal coupled to the output terminal of the second AND gate, and an output terminal for outputting the correction pulse signal.

2. The hold-time optimization circuit as claimed in claim 1, wherein the rising-edge detector comprises:

a first inverter, wherein the first inverter has an input terminal for receiving the bit, and an output terminal; and
a third AND gate, wherein the third AND gate has a first input terminal for receiving the bit, a second input terminal coupled to the output terminal of the first inverter, and an output terminal for outputting the first detection signal.

3. The hold-time optimization circuit as claimed in claim 1, wherein the falling-edge detector comprises:
a second inverter, wherein the second inverter has an input terminal for receiving the bit, and an output terminal; and
an NOR gate, wherein the NOR gate has a first input terminal for receiving the bit, a second input terminal coupled to the output terminal of the second inverter, and an output terminal for outputting the second detection signal.

4. A hold-time optimization circuit, comprising:
a delay control circuit, delaying a clock signal for a delay time so as to generate a delay clock signal, wherein the delay time is adjusted according to a correction pulse signal; and
a correction circuit, generating the correction pulse signal according to transition edges of a data signal and transition edges of the delay clock signal,
wherein the data signal is sampled according to the delay clock signal;
wherein the data signal comprises a plurality of bits, and the correction circuit comprises a plurality of glitch generation circuits;
wherein each of the glitch generation circuits comprises:
a rising-edge detector, generating a first detection signal according to rising edges of a respective bit;
a falling-edge detector, generating a second detection signal according to falling edges of the respective bit;
a first AND gate, wherein the first AND gate has a first input terminal for receiving the first detection signal, a second input terminal coupled to the delay clock signal, and an output terminal;
a second AND gate, wherein the second AND gate has a first input terminal for receiving the second detection signal, a second input terminal coupled to the delay clock signal, and an output terminal; and
a first OR gate, wherein the first OR gate has a first input terminal coupled to the output terminal of the first AND gate, a second input terminal coupled to the output terminal of the second AND gate, and an output terminal.

5. The hold-time optimization circuit as claimed in claim 4, wherein the correction circuit further comprises a second OR gate, and wherein the second OR gate has a plurality of input terminals respectively coupled to the output terminals of all of the first OR gates of the glitch generation circuits, and an output terminal for outputting the correction pulse signal.

6. The hold-time optimization circuit as claimed in claim 4, wherein the rising-edge detector comprises:
a first inverter, wherein the first inverter has an input terminal for receiving the respective bit, and an output terminal; and
a third AND gate, wherein the third AND gate has a first input terminal for receiving the respective bit, a second input terminal coupled to the output terminal of the first inverter, and an output terminal for outputting the first detection signal.

7. The hold-time optimization circuit as claimed in claim 4, wherein the falling-edge detector comprises:
a second inverter, wherein the second inverter has an input terminal for receiving the respective bit, and an output terminal; and
an NOR gate, wherein the NOR gate has a first input terminal for receiving the respective bit, a second input terminal coupled to the output terminal of the second inverter, and an output terminal for outputting the second detection signal.

8. The hold-time optimization circuit as claimed in claim 1, wherein the delay control circuit comprises:
a first switch, wherein the first switch has a first terminal coupled to a control node, and a second terminal coupled to a direct current (DC) voltage source;
a second switch, wherein the second switch has a first terminal coupled to a current source, and a second terminal coupled to the control node;
a capacitor, wherein the capacitor has a first terminal coupled to the control node, and a second terminal coupled to a ground voltage; and
a voltage-controlled delay (VCD) circuit, delaying the clock signal for the delay time, and generating the delay clock signal, wherein the delay time is determined by a control voltage at the control node.

9. The hold-time optimization circuit as claimed in claim 8, wherein when the hold-time optimization circuit has been powered on, the first switch switches from a closed state to an opened state and is kept opened, wherein every time the second switch receives the correction pulse signal equal to a high logic level, the second switch is closed, and wherein every time the second switch receives the correction pulse signal equal to a low logic level, the second switch is opened.

10. The hold-time optimization circuit as claimed in claim 9, wherein if the control voltage is increased, the delay time becomes shorter.

11. The hold-time optimization circuit as claimed in claim 1, wherein the delay control circuit comprises:
a counter, counting a digital number, wherein every time the counter receives the correction pulse signal equal to a high logic level, the counter increases the digital number; and
a digital-controlled delay (DCD) circuit, delaying the clock signal for the delay time, and generating the delay clock signal, wherein the delay time is determined by the digital number.

12. The hold-time optimization circuit as claimed in claim 11, wherein if the digital number is increased, the delay time becomes shorter.

13. A receiver, comprising:
a data delay circuit, delaying a data signal so as to generate a delay data signal;
a hold-time optimization circuit, comprising:
a delay control circuit, delaying a clock signal for a delay time so as to generate a delay clock signal, wherein the delay time is adjusted according to a correction pulse signal; and
a correction circuit, generating the correction pulse signal according to transition edges of the delay data signal and transition edges of the delay clock signal; and
a D flip-flop, wherein the D flip-flop has a data terminal for receiving the delay data signal, a clock terminal for receiving the delay clock signal, and an output terminal for outputting a sampling signal;
wherein the delay data signal comprises a bit, and the correction circuit comprises a glitch generation circuit;
wherein the glitch generation circuit comprises:
a rising-edge detector, generating a first detection signal according to the bit;

a falling-edge detector, generating a second detection signal according to the bit;

a first AND gate, wherein the first AND gate has a first input terminal for receiving the first detection signal, a second input terminal coupled to the delay clock signal, and an output terminal;

a second AND gate, wherein the second AND gate has a first input terminal for receiving the second detection signal, a second input terminal coupled to the delay clock signal, and an output terminal; and a first OR gate, wherein the first OR gate has a first input terminal coupled to the output terminal of the first AND gate, a second input terminal coupled to the output terminal of the second AND gate, and an output terminal for outputting the correction pulse signal.

14. The receiver as claimed in claim 13, wherein the delay control circuit comprises:

a current source, wherein the current source has a current output terminal;

a DC (Direct Current) voltage source, wherein the DC voltage source has a positive electrode, and a negative electrode coupled to a ground voltage;

a first switch, wherein the first switch has a first terminal coupled to a control node, and a second terminal coupled to the positive electrode of the DC voltage source;

a second switch, wherein the second switch has a first terminal coupled to the current output terminal of the current source, and a second terminal coupled to the control node;

a capacitor, wherein the capacitor has a first terminal coupled to the control node, and a second terminal coupled to the ground voltage; and a voltage-controlled delay (VCD) circuit, delaying the clock signal for the delay time, and generating the delay clock signal, wherein the delay time is determined by a control voltage at the control node.

15. The receiver circuit as claimed in claim 13, wherein the delay control circuit comprises:

a counter, counting a digital number, wherein every time the counter receives the correction pulse signal equal to a high logic level, the counter increases the digital number; and a digital-controlled delay (DCD) circuit, delaying the clock signal for the delay time, and generating the delay clock signal, wherein the delay time is determined by the digital number.

\* \* \* \* \*